(12) United States Patent
Parkhe et al.

(10) Patent No.: US 9,196,514 B2
(45) Date of Patent: Nov. 24, 2015

(54) ELECTROSTATIC CHUCK WITH VARIABLE PIXILATED HEATING

(71) Applicants: Vijay D. Parkhe, San Jose, CA (US); Wendell Boyd, Jr., Morgan Hill, CA (US)

(72) Inventors: Vijay D. Parkhe, San Jose, CA (US); Wendell Boyd, Jr., Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/085,026

(22) Filed: Nov. 20, 2013

(65) Prior Publication Data

US 2015/0070814 A1 Mar. 12, 2015

Related U.S. Application Data

(60) Provisional application No. 61/874,525, filed on Sep. 6, 2013.

(51) Int. Cl.
| | |
|---|---|
| *H01L 21/683* | (2006.01) |
| *H01L 23/00* | (2006.01) |
| *H01L 21/67* | (2006.01) |

(52) U.S. Cl.
CPC .... *H01L 21/67109* (2013.01); *H01L 21/67115* (2013.01); *H01L 21/67248* (2013.01); *H01L 21/6831* (2013.01)

(58) Field of Classification Search
USPC ........................................................ 361/234
See application file for complete search history.

(56) References Cited

U.S. PATENT DOCUMENTS

| | | | |
|---|---|---|---|
| 2007/0258186 A1* | 11/2007 | Matyushkin et al. | ......... 361/234 |
| 2008/0064126 A1 | 3/2008 | Gaff | |
| 2012/0115254 A1 | 5/2012 | Singh | |
| 2013/0088809 A1 | 4/2013 | Parkhe et al. | |

FOREIGN PATENT DOCUMENTS

| | | |
|---|---|---|
| JP | 2001223257 | 8/2001 |
| JP | 2004087571 | 3/2004 |
| KR | 1020070073391 | 7/2007 |

OTHER PUBLICATIONS

JDSU, "High-Power 8.5 W 9xx nm Fiber-Coupled Diode Laser, 6397-L3 Series" JDSU Commercial Lasers, JDS Uniphase Corporation, 2007, 5 pgs.

International Search Report and Written Opinion from PCT/US2014/052997 mailed Dec. 4, 2014, 9 pgs.

* cited by examiner

*Primary Examiner* — Dharti Patel
(74) *Attorney, Agent, or Firm* — Blakely Sokoloff Taylor Zafman LLP

(57) ABSTRACT

Electrostatic chucks with variable pixelated heating are described. For example, an electrostatic chuck (ESC) includes a ceramic plate having a front surface and a back surface, the front surface for supporting a wafer or substrate. A base is coupled to the back surface of the ceramic plate. A light carrying medium is disposed in the base, the light carrying medium configured to provide pixelated light-based heating capability for the ESC.

20 Claims, 6 Drawing Sheets

ELECTROSTATIC CHUCK WITH VARIABLE PIXILATED HEATING

CROSS-REFERENCE TO RELATED APPLICATIONS

This application claims the benefit of U.S. Provisional Application No. 61/874,525, filed on Sep. 6, 2013, the entire contents of which are hereby incorporated by reference herein.

BACKGROUND

1) Field

Embodiments of the present invention pertain to the field of semiconductor processing equipment and, in particular, to electrostatic chucks with variable pixelated heating.

2) Description of Related Art

In a plasma processing chamber, such as a plasma etch or plasma deposition chamber, the temperature of a chamber component is often an important parameter to control during a process. For example, a temperature of a substrate holder, commonly called a chuck or pedestal, may be controlled to heat/cool a workpiece to various controlled temperatures during the process recipe (e.g., to control an etch rate). Similarly, a temperature of a showerhead/upper electrode, chamber liner, baffle, process kit, or other component may also be controlled during the process recipe to influence the processing. Conventionally, a heat sink and/or heat source is coupled to the processing chamber to maintain the temperature of a chamber component at a desired temperature. Often, at least one heat transfer fluid loop thermally coupled to the chamber component is utilized to provide heating and/or cooling power.

Long line lengths in a heat transfer fluid loop, and the large heat transfer fluid volumes associated with such long line lengths are detrimental to temperature control response times. Point-of-use systems are one means to reduce fluid loop lengths/volumes. However, physical space constraints disadvantageously limit the power loads of such point-of-use systems.

With plasma processing trends continuing to increase RF power levels and also increase workpiece diameters (with 300 mm now typical and 450 mm systems now under development), temperature and/or RF control and distribution addressing both a fast response time and high power loads is advantageous in the plasma processing field.

SUMMARY

Embodiments of the present invention include electrostatic chucks with variable pixelated heating.

In an embodiment, an electrostatic chuck (ESC) includes a ceramic plate having a front surface and a back surface, the front surface for supporting a wafer or substrate. A base is coupled to the back surface of the ceramic plate. A light carrying medium is disposed in the base, the light carrying medium configured to provide pixelated light-based heating capability for the ESC.

In another embodiment, a semiconductor processing system includes a chamber coupled to an evacuation device, a gas inlet device, a plasma ignition device, and a detector. A computing device is coupled with the plasma ignition device. A voltage source is coupled with a sample holder including an electrostatic chuck (ESC). The ESC is disposed in the chamber and includes a ceramic plate having a front surface and a back surface, the front surface for supporting a wafer or substrate. The ESC also includes a base coupled to the back surface of the ceramic plate. The ESC also includes a light carrying medium disposed in the base, the light carrying medium configured to provide pixelated light-based heating capability for the ESC.

In another embodiment, a method of controlling a temperature of an electrostatic chuck (ESC) involves providing first level temperature control of the ESC by controlling a temperature of a cooling base of the ESC. The method also involves providing second level temperature control of the ESC by controlling a temperature of one or more electrical heaters of the ESC. The method also involves providing third level temperature control of the ESC by controlling a light carrying medium of the ESC.

DETAILED DESCRIPTION

Figure 1:
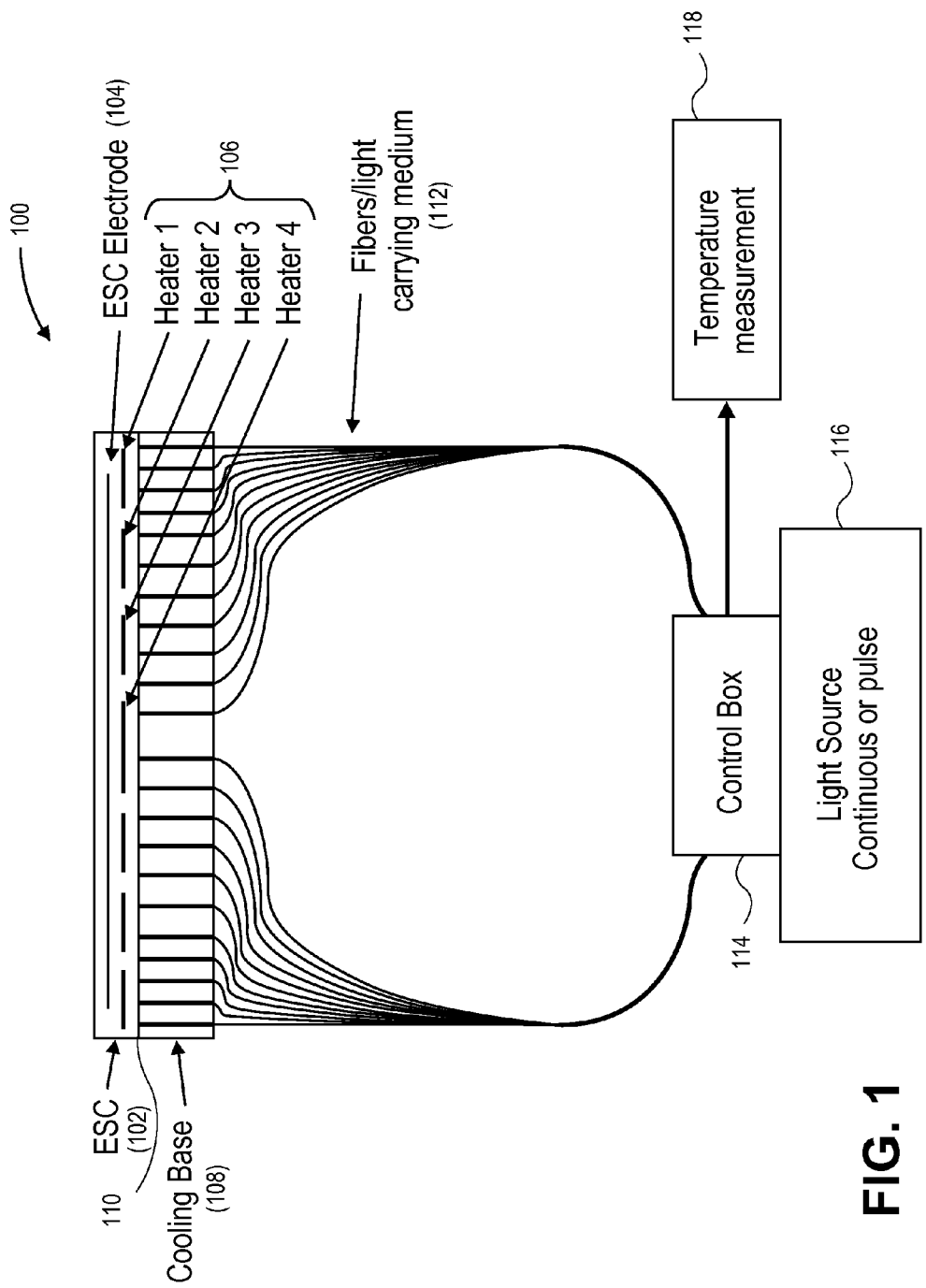
FIG. 1 illustrates a cross-sectional view of a portion of an electrostatic chuck (ESC) configured to support a wafer or substrate, in accordance with an embodiment of the present invention.

Electrostatic chucks with variable pixelated heating are described. In the following description, numerous specific details are set forth, such as specific chuck and/or chamber configurations, in order to provide a thorough understanding of embodiments of the present invention. It will be apparent to one skilled in the art that embodiments of the present invention may be practiced without these specific details. In other instances, well-known aspects, such as etch processing in the presence of a wafer supported by a chuck, are not described in detail in order to not unnecessarily obscure embodiments of the present invention. Furthermore, it is to be understood that the various embodiments shown in the Figures are illustrative representations and are not necessarily drawn to scale.

One or more embodiments described herein relate to electrostatic chucks with variable pixelated heating or systems including electrostatic chucks with variable pixelated heating capabilities. In particular, variable pixelated heating may be incorporated into a bonded electrostatic chuck using fibers and a control system to power specific fibers. Applications may include increased temperature and temperature uniformity control for pedestals or electrostatic chucks, e.g., as included in semiconductor processing chambers.

To provide context, demand for very uniform wafer temperature and tunability on an electrostatic chuck is ever increasing. However, limitations to improved performance may arise from cold spots and/or hot spots across a single chuck. Such cold or hot spot formation may arise from, e.g., spatial 4 zone heater resistance variation or bond uniformity thickness. As such, in an embodiment, additional tunability for controlling compensation thermally in a pedestal or chuck is disclosed herein. However, in specific embodiment, for RF considerations, implementation of greater tenability is achieved without inclusion of additional electrical connections within the pedestal or chuck.

More generally, wafer clamping by means of electrostatic chucking has been used to provide temperature control during etch processing. The wafer is clamped to a ceramic or multilayer surface with a heat sink or heater (or both) depending on application. Due to inherent non-uniformities and auxiliary hardware (e.g., lifter pins, RF/DC electrode(s), etc.) the ceramic surface temperature is not uniform. This non-uniformity translates to the wafer, affecting the etch process. Conventional chuck designs have concentrated on coolant layout optimization and introduction of multiple (up to 4 zones) heaters. Such chuck designs have not been useful for solving issue related to, or caused by, auxiliary hardware (e.g., lifter pins, RF/DC electrode(s), etc.).

More specifically, conventional electrostatic chuck temperature control is typically based on a cooling base and one or more electrical heaters included in the electrostatic chuck. Such an arrangement, however, can have flaws or drawbacks that lead to some level of temperature non-uniformity. For example, bond imperfection between the ceramic layer of the electrostatic chuck and an underlying cooling base which results in thickness variation between the ceramic plate and cooling base can lead to the formation of cold or hot spots across the check. In another example, plasma density variation, e.g., in a plasma etch or deposition chamber, can lead to the formation of hot or cold spots across a wafer or substrate supported by the chuck or pedestal. In yet another example, electrode non-uniformity within the chuck can also lead to the formation of cold and/or hot spots across the chuck.

A previous solution attempting to address the above concerns involved the incorporation of numerous resistive elements into the electrostatic chuck to provide fine tuning temperature control. The resistive elements are essentially auxiliary heaters used in conjunction with electrical heaters within the chuck and with the cooling base to control temperature uniformity. However, the addition of such resistive heaters can lead to arcing issues when an RF environment is used, e.g., when an RF electrode is active within the chuck or pedestal.

By contrast, as described herein, light energy is used instead of thermal resistance for fine tuning of temperature uniformity. One or more advantages of implemental discrete temperature control by light heating include, but are not limited to, (1) the ability to heat specific area(s) of a pedestal or electrostatic chuck, (2) special perforated bonding can allow direct heating of a back side of a ceramic chuck or pedestal, (3) RF interface issue mitigation as heating is light based, (4) a control system which allows only specific fibers are used for heating based on cold spot map. As such, in an embodiment, in order to address the above described issues with conventional approaches, next generation (beyond 4-zone) etch chamber ESC with extreme temperature uniformity is described. Embodiments described herein may be directed to next generation etch chamber ESCs with active temperature control.

As a general example, FIG. 1 illustrates a cross-sectional view of a portion of an electrostatic chuck (ESC) configured to support a wafer or substrate, in accordance with an embodiment of the present invention.

Referring to FIG. 1, a pixelated electrostatic chuck 100 includes an electrostatic chuck portion 102 (e.g., an $Al_2O_3$ or like solid ceramic plate). The electrostatic chuck portion includes an ESC electrode 104 (e.g., for RF applications) and a plurality of main heaters 106, such as heaters 1, 2, 3, 4, etc. In the embodiment shown, a single or mono-polar ESC electrode configuration is used. The ESC portion 102 is bonded to a cooling base 108 through a bonding layer 110. A plurality of fibers/light carrying medium 112 is disposed in the cooling base 108. The plurality of fibers/light carrying medium 112 is coupled to a control box 114. The control box 114 may be further coupled to a light source 116, such as a continuous or pulse light source. As such, the configuration of pixelated electrostatic chuck 100 includes fiber optic routing on the back side of the electrostatic chuck. As described in greater detail below, the control box may include or be coupled to a temperature measurement device 118, as is depicted in FIG. 1.

Referring again to FIG. 1, apparatus 100 has three level of temperature control: the first level provided by the cooling base 108 (e.g., as a chiller plate with an Al body and capability for fluid there through), the second level provided by the electrical heaters 106, and the third level provided by the fibers/light carrying medium 112 which provide light for heating, e.g., with pixelated individual die control by light heating. By providing all three levels of temperature control, in an embodiment, less than 1 degree non-uniformity over a 300 mm plate may be achieved. For example, in accordance with an embodiment of the present invention, an electrostatic chuck (ESC) has 1 or more (e.g., up to 8) main heaters to along with a cooling base to provide baseline temperature control. To provide fine-tuning of temperature distribution, a large number of light heating elements (e.g., light pipes, fiber optics, etc.) is position at the back of the ESC. To reduce RF-related non-uniformity, the fine-tuning light heaters are not resistance based. Thus, in an embodiment, etch processing with improved RF uniformity and/or improved temperature uniformity can be achieved.

Figure 2A:
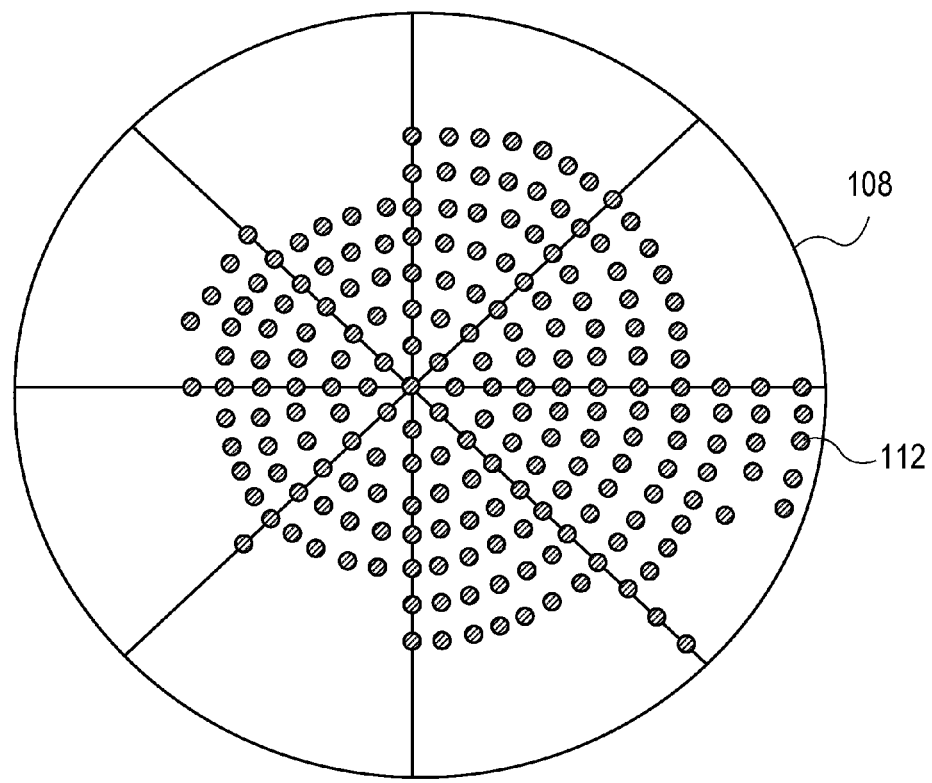
FIG. 2A is a plan view showing possible patterning of a plurality of fibers/light carrying medium, in accordance with an embodiment of the present invention.

FIG. 2A is a plan view showing possible patterning of a plurality of fibers/light carrying medium, in accordance with an embodiment of the present invention. Referring to FIG. 2A, the cooling base 108 has the plurality of fibers/light carrying medium 112 therein. Any suitable arrangement may be made for inclusion of the plurality of fibers/light carrying medium 112. In one such example, a layout of the plurality of fibers/light carrying medium has between 200 to 500 input points on the back of the ceramic plate 110. Although a very specific pattern is depicted in FIG. 2A for illustrative purposes, other embodiments include an entirely symmetric pattern. The pattern of 2A, in that case, may be used to depict only those plurality of fibers/light carrying medium 112 that are active for heating cool spots on the ceramic plate 110. Thus, it is to be understood that FIG. 2A illustrates only one of many possibilities of total included fibers/light carrying medium 112, or a subset of activated fibers/light carrying medium 112 in a specific application.

Figure 2B:
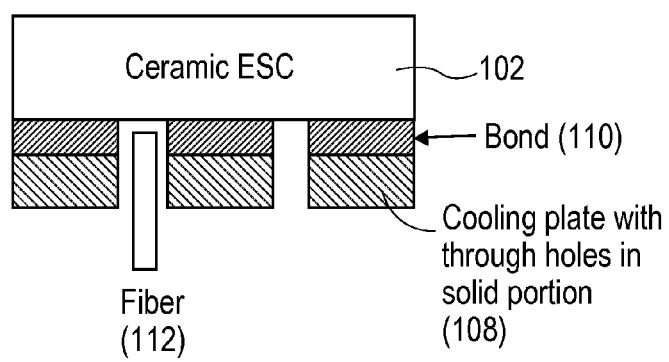
FIG. 2B illustrates a cross-sectional view of a portion of an electrostatic chuck (ESC) with pixelated light-based heating capability, in accordance with an embodiment of the present invention.

FIG. 2B illustrates a cross-sectional view of a portion of an electrostatic chuck (ESC) with pixelated light-based heating capability, in accordance with an embodiment of the present invention. Referring to FIG. 2B, the ESC portion 102, the cooling base 108 and the bonding layer 110 are depicted. Additionally, a fibers/light carrying medium 112 is depicted as accessing the ESC from the backside of the ESC portion

102. In an embodiment, as depicted, the bond layer is perforated to allow access of the fiber 112 to the backside of the ESC portion 102. Thus, light energy provided through the fiber 112 can be used to heat a very localized portion of the ESC portion 102. In a particular embodiment, such localized heating is considered pixelated and is used to reduce cool spots on a die by die basis, or other small region basis, of a wafer processes on the ESC. In a specific embodiment, then, bonding is used with perforations such that when the cooling plate is bonded to the ceramic, the fiber can access the through-hole in the bond.

Figure 3:
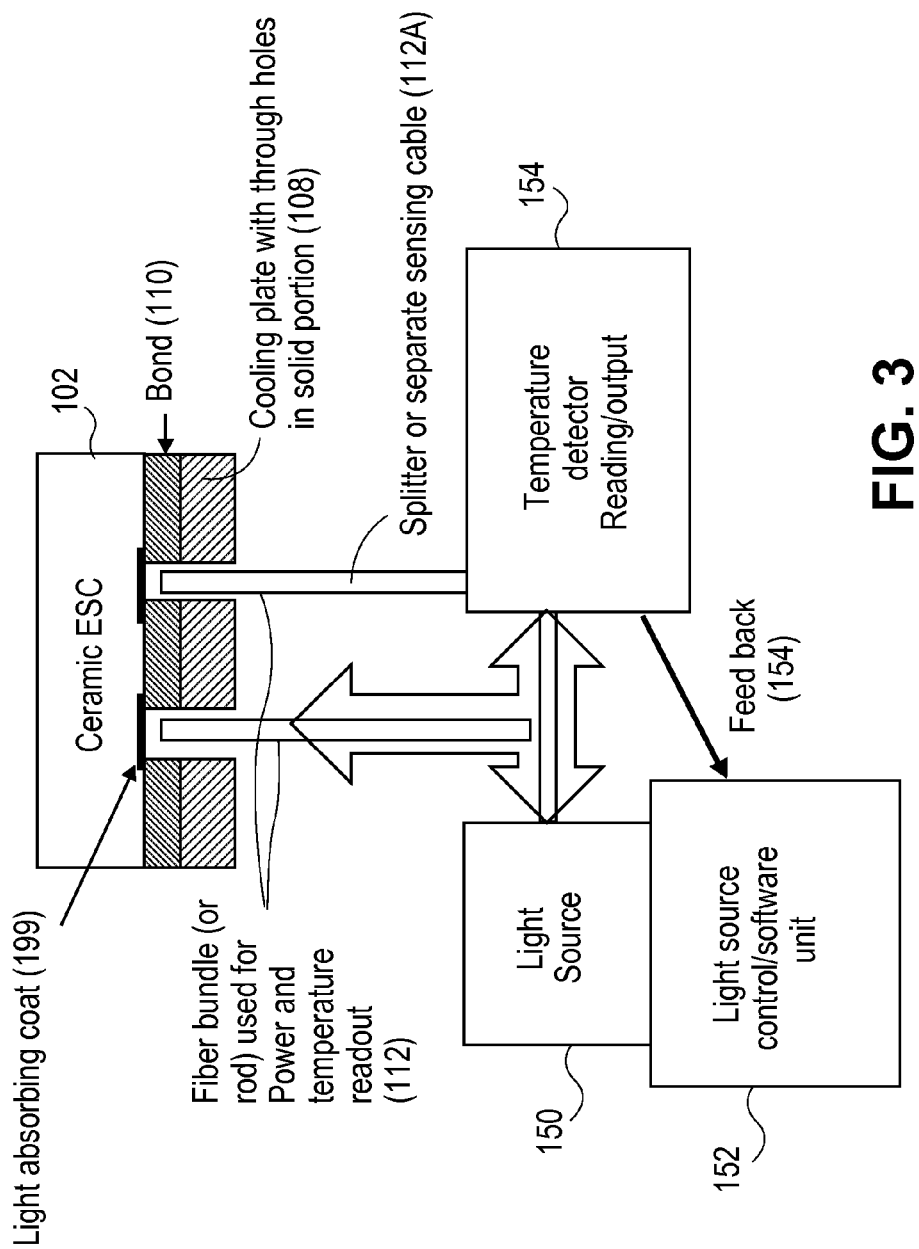
FIG. 3 illustrates a cross-sectional view of a portion of an electrostatic chuck (ESC) with pixelated light-based heating capability, in accordance with another embodiment of the present invention.

In another aspect, an optical coating may be included on the back of the ceramic to increase the efficiency of light absorption. Furthermore, in yet another aspect, a same fiber bundle may be used with a split such that one part is used for power and the other for temperature measurement from the back ceramic (alternatively, a separate side by location for read out may be implemented). As an example of both aspects, FIG. 3 illustrates a cross-sectional view of a portion of an electrostatic chuck (ESC) with pixelated light-based heating capability, in accordance with another embodiment of the present invention. Referring to FIG. 3, the ESC portion 102, the cooling base 108 and the bonding layer 110 are depicted. Additionally, a fibers/light carrying medium 112 is depicted as accessing the ESC from the backside of the ESC portion 102. In an embodiment, as depicted, the bond layer 110 is perforated to allow access of the fiber 112 to the backside of the ESC portion 102. Furthermore, a light absorbing coating 199 is included on the exposed portions of the ESC portion 102. Thus, light energy provided through the fiber 112 can be used to heat a very localized portion of the ESC portion 102, which is enhanced by the coating 199. Referring again to FIG. 3, a splitter or separate sensing cable 112A is included for temperature detection separate from the fiber 112. A feedback process 154 may include communication among a light source 150, a light source control/software unit 152 and a temperature detector reading/output module 154, as is depicted in FIG. 3.

In an embodiment, the fibers/light carrying medium 112 can include one or more of a variety of light sources such as LEDs, fiber lasers or conventional light with a lens system. As a specific example, a high power 8.5 W 9xx nm Fiber-Coupled Diode Laser available from JDS Uniphase Corporation is used. In an embodiment, heating through one or more of the fibers/light carrying medium 112 is achieved by first obtaining a signal for temperature at a particular location of the ceramic. Then, each fiber under the ceramic is controlled for fine tuned temperature (e.g., to control CD uniformity on a wafer, where different CDs are obtained as a function of temperature of about 0.5 nanometer to 1° C. increase in temperature). A control system which maps CDU from wafer to heat input on fiber may be used. In an embodiment, approximately 1000 watts (e.g., in the range of 200 W to 2000 W) is used for heating through the fibers/light carrying medium 112 of FIGS. 1 and 2A, 2B and 3. Thus, in one such embodiment, in the case of a 250 fiber system, about 4 W is provided through each of the fibers/light carrying medium 112.

In an embodiment, the fibers/light carrying medium 112 may be used to obtain the signal for temperature detection prior to activating/heating through select ones of the fibers/light carrying medium 112. As an example, the fibers/light carrying medium 112 may be used as a pyrometer (in addition to a heat source) to receive radiation from ESC electrode reflection or emission to allow for temperature reading. Alternatively (not shown), such radiation could be obtained from the substrate or wafer in a case where the fibers/light carrying medium 112 further projects through the ceramic layer.

As described above, light-based pixelated heating functionality may be included in an electrostatic chuck as a third level of heating uniformity control, where the first and second levels of heating uniformity control are provided by a cooling base and electrical heaters. As an example, FIG. 4 illustrates a side schematic view of a substrate support suitable for accommodating light-based pixelated heating functionality, in accordance with some embodiments of the present invention.

Figure 4:
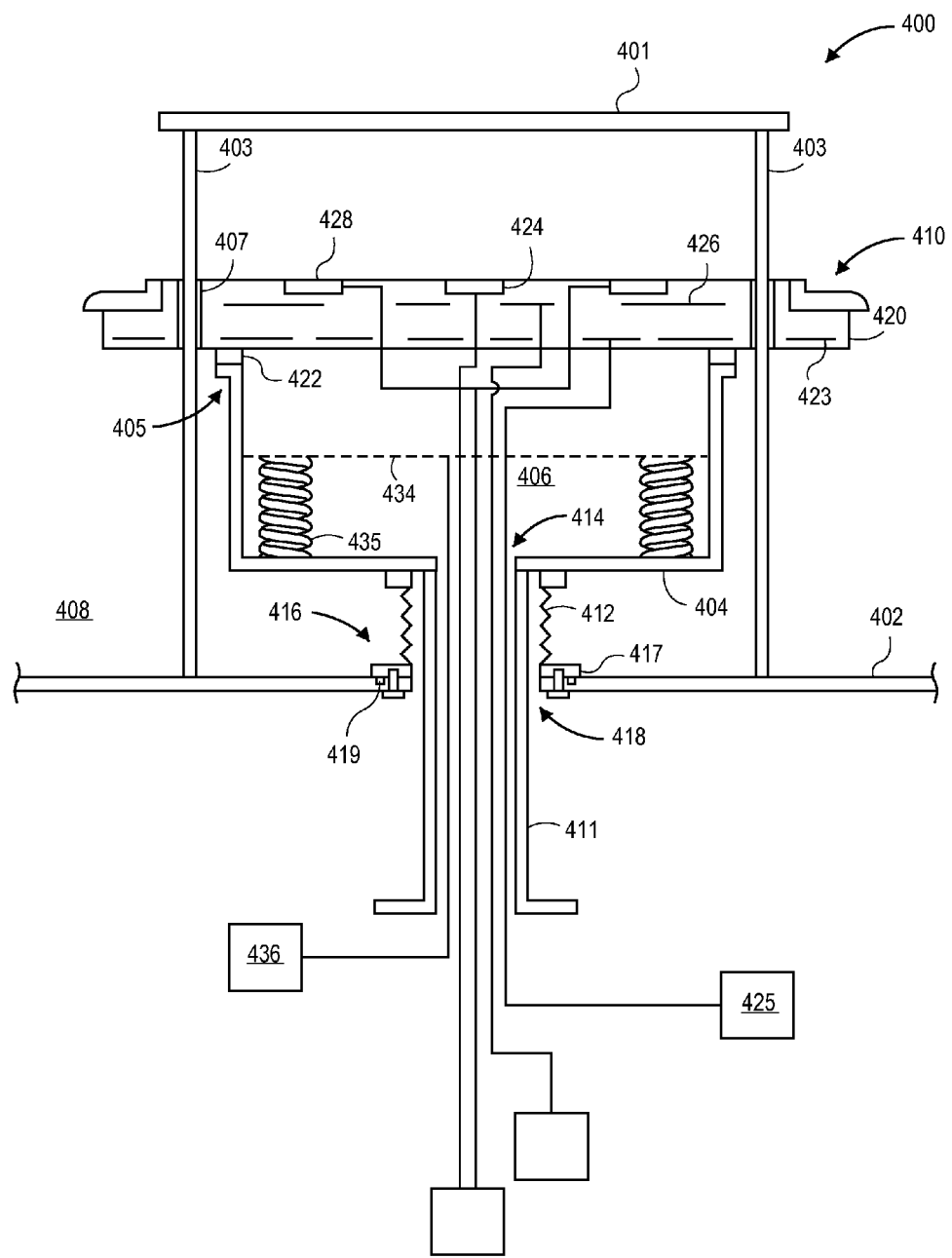
FIG. 4 illustrates a side schematic view of a substrate support, in accordance with some embodiments of the present invention.

FIG. 4 depicts a side schematic view of a substrate support 400 in accordance with some embodiments of the present invention. As illustrated in FIG. 4, the substrate support 400 is configured in a loading position to either receive or remove a substrate 401. For example, as illustrated in FIG. 4 and in the loading position, the substrate 401 may rest on a plurality of lift pins 403 above the substrate support 400. The lift pins 403 are movable with respect to a support surface of the substrate support 400, for example, via lift pin holes 407 that facilitate relative movement of the lift pins 403. The substrate support 400 may be disposed in a process chamber (a cut away view of a chamber wall 402 is illustrated in FIG. 4). The process chamber may be any suitable substrate processing chamber.

The substrate support 400 may include a body 404. The body 404 may have an interior volume 406 that is separated from a processing volume 408 of the process chamber. The interior volume 406 may be held at atmosphere, for example, about 14.7 pounds per square inch (psi), or be held under an inert atmosphere, such as nitrogen ($N_2$) or the like. The interior volume 406 is further isolated from, and protected from, any gases that may be present in the processing volume 408 of the process chamber. The process volume 408 may be held at atmospheric or sub-atmospheric pressures.

The interior volume 406 may be enclosed by an electrostatic chuck 410 at an upper end 405 of the body 404 and by a feed through structure 411, which may be welded or brazed to a lower opening 414 of the body 404. For example, as illustrated in FIG. 4, a bellows 412 may surround at least a portion of the feed through structure 411 and isolate the processing volume 408 from the exterior of the chamber and the interior volume 406. The bellows 412 may provide both a flexible section to facilitate motion of the substrate support 400 and a pathway for providing gases, electrical power, coolants at the like to the substrate support 400. The gases, electrical power, coolant and the like may be by provided via the feed through structure 411.

The bellows 412 may be coupled to the body 404 at the lower opening 414, for example, by welding or brazing. An opposing lower end 416 of the bellows 412 may be coupled to an opening 418 in the chamber wall 402. For example, as illustrated in FIG. 4, the lower end 416 of the bellow 412 may include a flange 417 which may be coupled via an o-ring 419, or copper gasket or the like to the chamber wall 402. The o-ring 419 may rest in a groove on the processing volume facing surface of the chamber wall 402. Other designs and coupling of the bellows 412 to the body 404 and the chamber wall 402 are possible.

The substrate support 400 may include a cooling plate 434 disposed in the interior volume 406 below the electrostatic chuck 410. For example, in some embodiments, the cooling plate 434 may be directly contacting an interior volume facing surface of the electrostatic chuck 410. However, this embodiment of the cooling plate 434 is merely exemplary and the cooling plate may not directly contact the electrostatic chuck 410. The cooling plate 434 may include a plurality of cooling channels (not shown) for circulating a coolant there through. The coolant may include any suitable liquid or gas coolant. In some embodiments, the coolant may be supplied to the cooling plate 434 via a coolant source 436 coupled to the cooling plate 434 via the feed through structure 411. For example, the cooling plate 434 may be engaged to the electrostatic chuck 410 by one or more springs 435 or any suitable engagement mechanism.

In some embodiments, the cooling plate 434 may include an inner and outer cooling plate. In some embodiments, the inner cooling plate may be disposed about a center gas line, and the outer cooling plate may be disposed about a plurality of outer gas lines. For example, the inner and outer cooling plates may be used to adjust cooling capacity depending on how the electrostatic chuck 410 is utilized, such as how electrical power is provided to the electrode(s) 426 and/or the one or more heaters 423 or the like. Further, the inner and outer cooling plates may be utilized to improve substrate temperature control or cool down the substrate support 400 from high temperatures. For example, the inner and outer cooling plates may be modulated to control heat transfer between the one or more heaters 423 and the substrate 401.

In some embodiments, the cooling plate 434 may include an upper and a lower cooling plate. The upper and lower cooling plates may be utilized to provide similar benefits as discussed above for the inner and outer cooling plates. The upper and lower cooling plates may be stacked such that upper cooling plate contacts the electrostatic chuck 410 via a foil while lower cooling plate contacts upper cooling plate. By independently controlling the flow of coolant to the upper and lower cooling plates, variable heat transfer is achieved between ceramic body 420 and cooling plate assembly 434. In some embodiments, each of the upper and lower cooling plates may provide uniform cooling over the entire diameter of cooling plate 434. In other embodiments, each of upper and lower cooling plates may provide different cooling to inner and outer regions of cooling plate 434. That is, in some embodiments, upper and lower cooling plates may be combined with inner and outer cooling plates.

The electrostatic chuck 410, thus, may include a ceramic plate 420. As illustrated in FIG. 4, the ceramic plate 420 may rest on a ring 422 disposed between the electrostatic chuck 410 and the upper end 405 of the body 404. For example, the ring 422 may comprise KOVAR™, or any suitable material. The ring 422 may secure the electrostatic chuck 410 to the upper end 405 of the body 404, for example, by welding or brazing the ring 422 to both the electrostatic chuck 410 and the upper end 405 of the body 404. The ceramic plate 420 may comprise any suitable ceramic material, such as aluminum nitride (AlN), aluminum oxide ($Al_2O_3$), or a doped ceramic, such as titania doped alumina or calcium doped aluminum nitride or the like. As illustrated in FIG. 4, the ceramic plate 420 may include a plurality of grooves 424 formed in a substrate supporting surface of the ceramic plate 420. The grooves may be used, for example, to provide a backside gas to a backside surface of the substrate 401. The ceramic plate 420 may further include an electrode or a plurality of electrodes 426, where the electrode(s) 426 may be used to secure the substrate 401 a processing surface 428 of the electrostatic chuck 410.

FIG. 4 illustrates the electrode(s) 426 in accordance with some embodiments of the invention. For example, as discussed above, the electrode(s) 426 may be utilized to secure the substrate 401 to the processing surface 428 of the electrostatic chuck 410. For example, in some embodiments, the electrode(s) 426 may utilized for controlled de-chucking from the electrostatic chuck 410, to chuck bowed substrates, or the like. For example, during de-chucking, gas may still be flowing through the grooves 424 and/or the pressure in the grooves may be higher than the pressure in the processing volume 408. Accordingly, for example, to prevent the substrate 401 from jumping off the electrostatic chuck 410, in the case of a plurality of electrodes, some of the electrodes 426 may be turned off prior to others to gradually de-chuck the substrate 401. For example, during chucking, larger substrates, such as 300 millimeter or greater, may be bowed. Accordingly, to flatten a bowed substrate against the electrostatic chuck 410, some of the electrodes 426 may be operated at a higher power and/or frequency that others of the electrodes 426 to flatten out the substrate.

As described above, the electrostatic chuck 410 may further include one or more heaters 423. The one or more heaters 423 may be coupled to one or more power supplies 425 and may be independently controllable. In some embodiments, the one or more heaters 423 may include a plurality of heaters 423, as illustrated in FIG. 4. For example, in some embodiments, the plurality of heaters 423 may include a central heater, a middle heater disposed about the central heater, and an outer heater disposed about the middle heater. Each of the central, middle and outer heaters may be coupled to the same or separate one or more power supplies 425 and independently controlled via a temperature feedback loop. For example, a first thermocouple may monitor a temperature of the ceramic plate 420 proximate the location of the central heater. Similarly, additional thermocouples may perform a similar function for the middle and outer heaters.

An electrostatic chuck with variable pixelated heating may be included in processing equipment suitable to provide an etch plasma in proximity to a sample for etching. For example, FIG. 5 illustrates a system in which an electrostatic chuck with variable pixelated heating can be housed, in accordance with an embodiment of the present invention.

Figure 5:
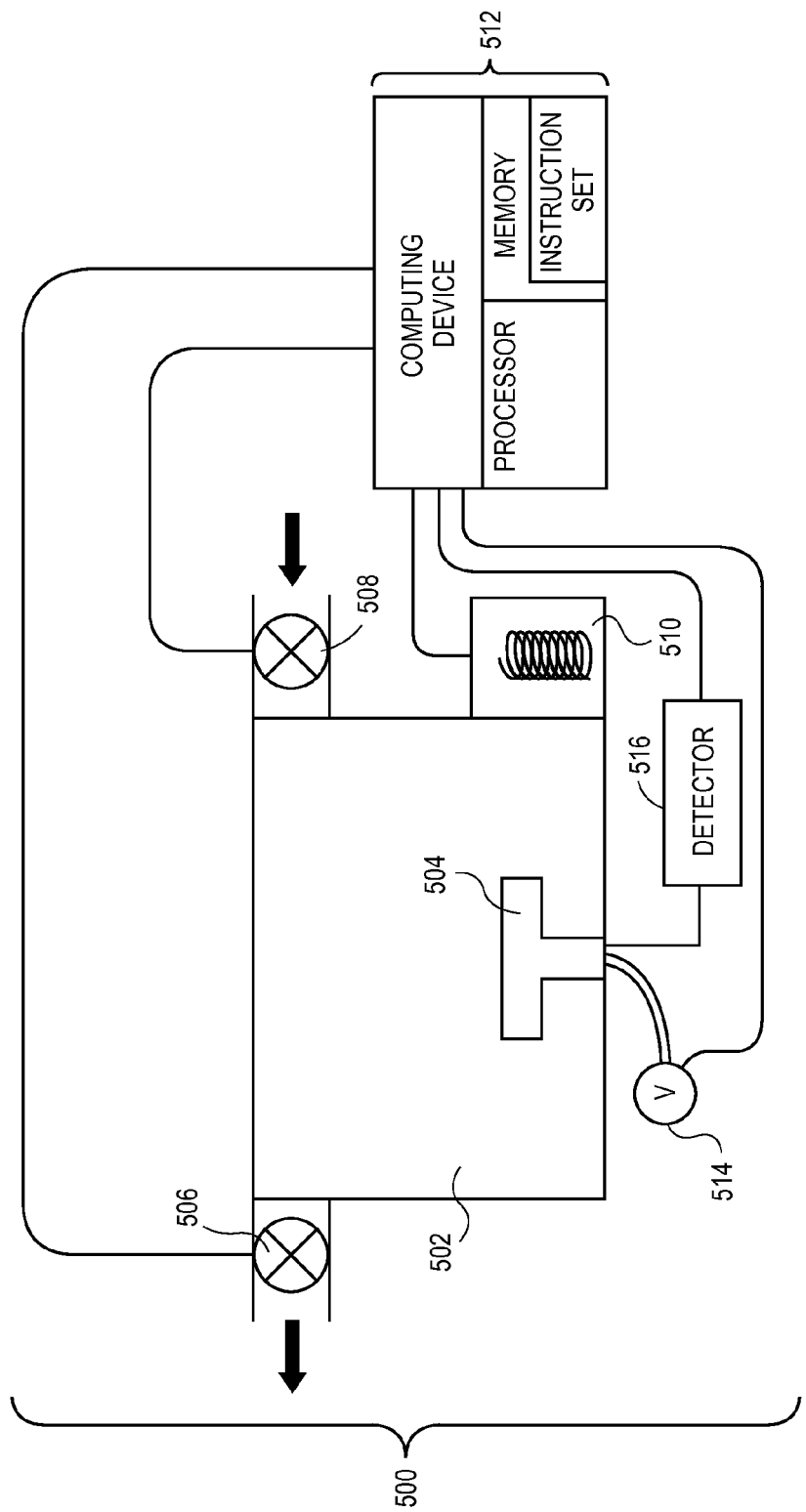
FIG. 5 illustrates a system in which an electrostatic chuck with variable pixelated heating can be housed, in accordance with an embodiment of the present invention.

Referring to FIG. 5, a system 500 for conducting a plasma etch process includes a chamber 502 equipped with a sample holder 504 (e.g., an ESC having variable pixelated heating capability such as described above). An evacuation device 506, a gas inlet device 508 and a plasma ignition device 510 are coupled with chamber 502. A computing device 512 is coupled with plasma ignition device 510. System 500 may additionally include a voltage source 514 coupled with sample holder 504 and a detector 516 coupled with chamber 502. Computing device 512 may also be coupled with evacuation device 506, gas inlet device 508, voltage source 514 and detector 516, as depicted in FIG. 5.

Chamber 502 and sample holder 504 may include a reaction chamber and sample positioning device suitable to contain an ionized gas, i.e. a plasma, and bring a sample in proximity to the ionized gas or charged species ejected there from. Evacuation device 506 may be a device suitable to evacuate and de-pressurize chamber 502. Gas inlet device 508 may be a device suitable to inject a reaction gas into chamber 502. Plasma ignition device 510 may be a device suitable for igniting a plasma derived from the reaction gas injected into chamber 502 by gas inlet device 508. Detection device 516 may be a device suitable to detect an end-point of a processing operation. In one embodiment, system 500 includes a chamber 502, a sample holder 504, an evacuation device 506, a gas inlet device 508, a plasma ignition device 510 and a detector 516 similar to, or the same as, a Conductor etch chamber or related chambers used on an Applied Materials® AdvantEdge system.

It is to be understood that although an etch chamber is described above, electrostatic chucks such as those described herein may instead be included in other semiconductor processing chambers. Examples of other suitable semiconductor processing chambers include, but are not limited to, chemical vapor deposition (CVD) or physical vapor deposition (PVD) process chambers.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
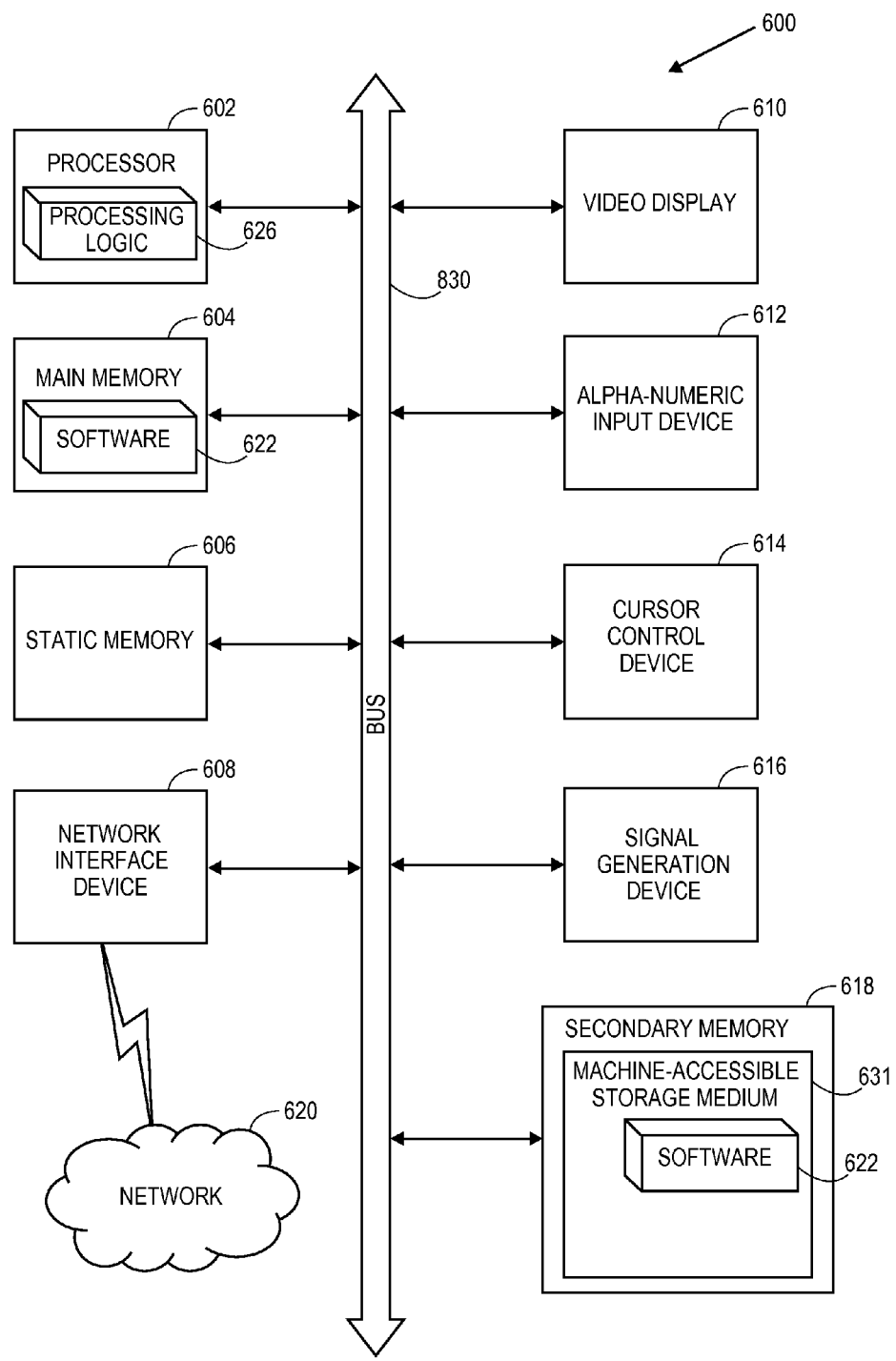
FIG. 6 illustrates a block diagram of an exemplary computer system, in accordance with an embodiment of the present invention.

FIG. 6 illustrates a diagrammatic representation of a machine in the exemplary form of a computer system 600 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In one embodiment, computer system 600 is suitable for use as computing device 512 described in association with FIG. 5 and/or control box 114 described in association with FIG. 1.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, electrostatic chucks with variable pixelated heating have been disclosed. In an embodiment, an electrostatic chuck (ESC) includes a ceramic plate having a front surface and a back surface, the front surface for supporting a wafer or substrate. A base is coupled to the back surface of the ceramic plate. A light carrying medium is disposed in the base, the light carrying medium configured to provide pixelated light-based heating capability for the ESC.

What is claimed is:

1. An electrostatic chuck (ESC), comprising:
a ceramic plate having a front surface and a back surface, the front surface for supporting a wafer or substrate;
a base coupled to the back surface of the ceramic plate; and
a light carrying medium disposed in the base, the light carrying medium configured to provide pixilated light-based heating capability for the ESC.

2. The ESC of claim 1, wherein the light carrying medium comprises a plurality of optical fibers.

3. The ESC of claim 2, where in the base is coupled to the back surface of the ceramic plate by a perforated bonding layer, the perforated bonding layer having openings to accommodate the plurality of optical fibers.

4. The ESC of claim 1, wherein the ceramic plate comprises one or more electrical heaters housed therein.

5. The ESC of claim 1, wherein the ceramic plate comprises an RF electrode housed therein.

6. The ESC of claim 1, wherein the base is a cooling base.

7. The ESC of claim 6, wherein the ceramic plate comprises one or more electrical heaters housed therein, wherein the one or more electrical heaters and the cooling base provide two levels of temperature uniformity control, and wherein the light carrying medium provides a third level of temperature uniformity control.

8. The ESC of claim 1, wherein the light carrying medium is further configured to provide temperature sensing capability.

9. The ESC of claim 1, wherein each of the plurality of optical fibers is independently controllable.

10. A semiconductor processing system, comprising:
a chamber coupled to an evacuation device, a gas inlet device, a plasma ignition device, and a detector;
a computing device coupled with the plasma ignition device;
a voltage source coupled with a sample holder comprising an electrostatic chuck (ESC), the ESC disposed in the chamber and comprising:
a ceramic plate having a front surface and a back surface, the front surface for supporting a wafer or substrate;
a base coupled to the back surface of the ceramic plate; and
a light carrying medium disposed in the base, the light carrying medium configured to provide pixilated light-based heating capability for the ESC.

11. The semiconductor processing system of claim 10, wherein the light carrying medium of the ESC comprises a plurality of optical fibers.

12. The semiconductor processing system of claim 11, where in the base of the ESC is coupled to the back surface of the ceramic plate of the ESC by a perforated bonding layer, the perforated bonding layer having openings to accommodate the plurality of optical fibers.

13. The semiconductor processing system of claim 10, wherein the ceramic plate of the ESC comprises one or more electrical heaters housed therein.

14. The semiconductor processing system of claim 10, wherein the ceramic plate of the ESC comprises an RF electrode housed therein.

15. The semiconductor processing system of claim 10, wherein the base of the ESC is a cooling base.

16. The semiconductor processing system of claim 15, wherein the ceramic of the ESC plate comprises one or more electrical heaters housed therein, wherein the one or more electrical heaters and the cooling base provide two levels of temperature uniformity control of the ESC, and wherein the light carrying medium provides a third level of temperature uniformity control of the ESC.

17. The semiconductor processing system of claim 10, wherein the light carrying medium of the ESC is further configured to provide temperature sensing capability.

18. The semiconductor processing system of claim 10, wherein each of the plurality of optical fibers of the ESC is independently controllable.

19. A method of controlling a temperature of an electrostatic chuck (ESC), the method comprising:
providing first level temperature control of the ESC by controlling a temperature of a cooling base of the ESC;
providing second level temperature control of the ESC by controlling a temperature of one or more electrical heaters of the ESC; and
providing third level temperature control of the ESC by controlling a light carrying medium of the ESC, the light carrying medium configured to provide pixilated light-based heating capability for the ESC.

20. The method of claim 19, wherein controlling the light carrying medium of the ESC further comprises temperature sensing using the light carrying medium.

* * * * *